US012404420B2

United States Patent
Kang et al.

(10) Patent No.: US 12,404,420 B2
(45) Date of Patent: Sep. 2, 2025

(54) ENCAPSULATING MATERIAL FOR COMPRESSION MOLDING AND ELECTRONIC PART DEVICE

(71) Applicant: Showa Denko Materials Co., Ltd., Tokyo (JP)

(72) Inventors: Dongchul Kang, Tokyo (JP); Seigo Okubo, Tokyo (JP)

(73) Assignee: Resonac Corporation, Tokyo (JP)

( * ) Notice: Subject to any disclaimer, the term of this patent is extended or adjusted under 35 U.S.C. 154(b) by 603 days.

(21) Appl. No.: 17/642,229

(22) PCT Filed: Sep. 11, 2020

(86) PCT No.: PCT/JP2020/034575
§ 371 (c)(1),
(2) Date: Mar. 11, 2022

(87) PCT Pub. No.: WO2021/049645
PCT Pub. Date: Mar. 18, 2021

(65) Prior Publication Data
US 2022/0315793 A1    Oct. 6, 2022

(30) Foreign Application Priority Data

Sep. 12, 2019 (WO) .................. PCT/JP2019/035934

(51) Int. Cl.
| | | |
|---|---|---|
| *C08G 59/18* | (2006.01) | |
| *C08K 9/06* | (2006.01) | |
| *C08K 13/06* | (2006.01) | |
| *C08L 63/00* | (2006.01) | |
| *C09D 7/40* | (2018.01) | |
| *C09D 7/62* | (2018.01) | |
| *C09D 163/00* | (2006.01) | |
| *H01L 23/29* | (2006.01) | |
| *C08L 63/02* | (2006.01) | |
| *C08L 63/04* | (2006.01) | |

(52) U.S. Cl.
CPC .......... *C09D 163/00* (2013.01); *C08G 59/18* (2013.01); *C08K 9/06* (2013.01); *C09D 7/62* (2018.01); *C09D 7/68* (2018.01); *C09D 7/69* (2018.01); *H01L 23/295* (2013.01); *C08K 2201/005* (2013.01)

(58) Field of Classification Search
None
See application file for complete search history.

(56) References Cited

U.S. PATENT DOCUMENTS

| | | | | |
|---|---|---|---|---|
| 2002/0043728 A1* | 4/2002 | Harada | .................. | H01L 24/29 |
| | | | | 257/788 |
| 2003/0201548 A1* | 10/2003 | Ikezawa | ................. | C08K 5/521 |
| | | | | 257/793 |
| 2008/0265438 A1 | 10/2008 | Asano | | |
| 2009/0062460 A1* | 3/2009 | Nakamura | ........... | C08G 77/395 |
| | | | | 524/611 |
| 2012/0280425 A1 | 11/2012 | Nishikawa | | |
| 2016/0102109 A1 | 4/2016 | Maeda | | |
| 2019/0055377 A1* | 2/2019 | Tsutsumi | ............. | C08G 59/245 |
| 2022/0106437 A1* | 4/2022 | Nishitani | ............. | H01L 23/295 |

FOREIGN PATENT DOCUMENTS

| | | |
|---|---|---|
| CN | 102686996 | 9/2012 |
| JP | 2003213095 | 7/2003 |
| JP | 2004307649 | 11/2004 |
| JP | 2005029641 A * | 2/2005 |
| JP | 2008279599 | 11/2008 |
| JP | 2011246522 | 12/2011 |
| JP | 2014141573 | 8/2014 |
| WO | 2011064964 | 6/2011 |
| WO | 2018123745 | 7/2018 |
| WO | 2021049645 | 3/2021 |

OTHER PUBLICATIONS

Machine translation of JP-2005029641-A (no date).*

* cited by examiner

*Primary Examiner* — Michael J Feely
(74) *Attorney, Agent, or Firm* — JCIPRNET

(57) ABSTRACT

An encapsulating material for compression molding includes an epoxy resin, a curing agent, and an inorganic filler. In an image obtained by observing, with an ultrasonic flaw detector, a compression-molded body formed by compression-molding the encapsulating material for compression molding on a substrate with a silicon chip interposed, the area of the portion other than dark spots of the region corresponding to the compression-molded body on the chip is 86% or more of the area of the entire region corresponding to the compression-molded body on the chip.

5 Claims, No Drawings ated by reference herein and made a part of this specification.

ENCAPSULATING MATERIAL FOR COMPRESSION MOLDING AND ELECTRONIC PART DEVICE

CROSS-REFERENCE TO RELATED APPLICATION

This application is a 371 application of the International PCT application serial no. PCT/JP2020/034575, filed on Sep. 11, 2020, which claims the priority benefits of the International PCT application serial no. PCT/JP2019/035934, filed on Sep. 12, 2019. The entirety of each of the above-mentioned patent applications is hereby incorporated by reference herein and made a part of this specification.

FIELD OF THE INVENTION

This disclosure relates to an encapsulating material for compression molding, and an electronic part device.

DESCRIPTION OF RELATED ART

Conventionally, in the field of element encapsulation of electronic part devices such as transistor and IC (Integrated Circuit), resin encapsulation has been the mainstream in view of the aspects of productivity and cost, etc. In addition, recently, high-density mounting of electronic parts on printed wiring boards has progressed. Along with this, for semiconductor devices, the mainstream has become from conventional pin-insertion packages to surface-mount packages. Surface-mount IC, and LSI (Large-Scale Integration), etc. are thin and compact packages for increasing the mounting density and reducing the mounting height, while the volume occupied by the element in the package increases and the wall thickness of the package is very thin.

In addition, the chip area and the number of pins are increasing due to the increase in the number of functions of elements and in the number of elements, and the number of pads (electrodes) is increased, so reduction of the pad pitch and pad dimensions, so-called pad pitch narrowing, is also in progress. In addition, for further miniaturization and weight reduction, the package form has been changing from QFP (Quad Flat Package) and SOP (Small Outline Package), etc. to CSP (Chip Size Package) and BGA (Ball Grid Array), etc. that are easier to support multiple pins and can be mounted at higher density.

Examples of resin encapsulating methods for electronic part devices include, in addition to the transfer molding method that is usually used, the compression molding method and so on (see Patent Literature 1, for example,). In the compression molding method, an encapsulating material, which is a powdery/granular resin composition, is supplied toward the object to be encapsulated held in a mold (such as a substrate provided with an electronic element such as a semiconductor chip), and then the object to be encapsulated and the encapsulating material are compressed to perform resin encapsulation.

CITATION LIST

Patent Literature

Patent Literature 1: Japanese Patent Laid-Open No. 2008-279599 (JP2008279599A)

SUMMARY OF THE INVENTION

Technical Problem

Along with the increase in the number of functions of packages, the wires built in have become thinner, so it is an issue to suppress the occurrence of wire sweep not only in transfer molding but also in compression molding.

In view of the aforementioned, an issue of the first embodiment of this disclosure is to provide an encapsulating material for compression molding that inhibits wire sweep caused by compression molding, and an electronic part device including an element encapsulated by the encapsulating material for compression molding.

Solution to Problem

In embodiments of this disclosure, the following aspects are included.

Aspect <1> is an encapsulating material for compression molding, which includes an epoxy resin, a curing agent, and an inorganic filler, wherein in an image obtained by observing, by an ultrasonic flaw detector, a compression-molded body formed by compression-molding the encapsulating material for compression molding on a substrate with a silicon chip interposed, the area of the portion other than dark spots of the region corresponding to the compression-molded body on the chip is 86% or more of the area of the entire region corresponding to the compression-molded body on the chip.

Aspect <2> is the encapsulating material for compression molding of <1> in which the inorganic filler has been treated with a coupling agent.

Aspect <3> is the encapsulating material for compression molding of <2> in which the coupling agent comprises a silane coupling agent.

Aspect <4> is the encapsulating material for compression molding of <2> or <3> in which the coupling agent has at least one functional group selected from a (meth)acryloyl group, an epoxy group and a phenyl group.

Aspect <5> is the encapsulating material for compression molding of any one of <2> to <4> in which the coupling agent has a secondary amino group.

Aspect <6> is the encapsulating material for compression molding of any one of <1> to <5>, wherein the volume-based particle size distribution of the inorganic filler has a maximum value at between 0.1 µm to 2 µm.

Aspect <7> is an electronic part device that includes: an element, and a cured product of the encapsulating material for compression molding of any one of <1> to <6> that encapsulates the element.

Advantageous Effects of Invention

With the first embodiment of this disclosure, an encapsulating material for compression molding that inhibits wire sweep caused by compression molding, and an electronic part device including an element encapsulated by the above encapsulating material, are provided.

DESCRIPTION OF THE EMBODIMENTS

Embodiments for implementing this invention will be described below in details, but this invention is not limited thereto. In the following embodiments, the components (including element steps and so on) are not essential unless otherwise specified. The same applies to the numerical values and their ranges, and does not limit this invention.

In this disclosure, the term "process" covers, in addition to a process independent of other processes, a process that cannot be clearly distinguished from other process(es), as long as the purpose of the process can be achieved.

In this disclosure, a numerical range indicated by using "-" includes the numerical values before and after "-" as the minimum value and the maximum value, respectively.

In numerical ranges described stepwise in this disclosure, the upper limit value or the lower limit value described in one numerical range may be replaced with the upper limit value or the lower limit value of another numerical range described stepwise. Further, in a numerical range described in this disclosure, the upper limit value or the lower limit value of the numerical range may be replaced with a value shown in the Examples.

In this disclosure, a component may contain a plurality of corresponding substances. When a plurality of substances corresponding to a component are present in the composition, the proportion or content of the component is the total proportion or content of the plurality of substances present in the composition, unless otherwise specified.

In this disclosure, the particles corresponding to a component may contain a plurality of kinds of particles. When a plurality of kinds of particles corresponding to a component are present in the composition, the particle size of the component means a value for the mixture of the plurality of kinds of particles present in the composition, unless otherwise specified.

In this disclosure, "(meth) acryloyl group" means at least one of an acryloyl group and a methacryloyl group, and "(meth) acryloyloxy group" means at least one of an acryloyloxy group and a methacryloyloxy group.

<Encapsulating Material for Compression Molding>

The encapsulating material for compression molding of this disclosure includes an epoxy resin, a curing agent, and an inorganic filler, wherein in an image obtained by observing, by an ultrasonic flaw detector, a compression-molded body formed by compression-molding the encapsulating material for compression molding on a substrate with a silicon chip interposed, the area of the portion other than dark spots of the region corresponding to the compression-molded body on the chip is 86% or more of the area of the entire region corresponding to the compression-molded body on the chip.

Hereafter, the encapsulating material for compression molding is also called "encapsulating material", the region corresponding to the image of the compression-molded body on the chip in the image obtained by observing, by an ultrasonic flaw detector, the compression-molded body formed by compression-molding the encapsulating material for compression molding on a substrate with a silicon chip interposed is also called "SAT image", and the proportion of the area of the portion other than dark spots in the area of the entire SAT image is also called "non-dark-spots proportion".

Because the encapsulating material of this disclosure has a non-dark-spots ratio in the above range after being made into a compression-molded body, wire sweep due to compression molding is suppressed. The reason is not clear, but it is presumed as follows.

In the SAT image, for example, a region where the resin is locally unevenly distributed (hereinafter, also referred to as a "resin-rich region") appears as a dark spot. It is considered that this resin-rich region is caused by, for example, that the gas dissolved in the encapsulating material induces bubble rupture under the depressurization in the compression molding and the amount of the inorganic filler is reduced locally at the bubble rupture portion. For example, for a encapsulating material having low fluidity, even if a region where the amount of the inorganic filler is locally reduced is generated, the inorganic filler is difficult to flow toward the region and into the region. Therefore, it is considered that the region where the amount of the inorganic filler is locally reduced is cured as it is to become a resin-rich region. It is considered that the encapsulating material having a lot of resin-rich regions has low fluidity, so that displacement of the wire (that is, wire sweep) easily occurs when the pressure during the compression molding is applied to the wire.

On the contrary, with the encapsulating material of this disclosure, from which a compression-molded body having a large non-dark-spots ratio is obtained, even if a portion with less inorganic filler is locally generated due to bubble rupture during depressurization, the inorganic filler can easily flow into the region by flowing so that generation of resin-rich regions is suppressed. Moreover, since the encapsulating material suppressing generation of resin-rich regions in such manner has high fluidity, it is presumed that the wire sweep due to compression molding is suppressed.

In addition, since the encapsulating material in which a lot of resin-rich regions are generated has low fluidity, air bubbles generated during compression molding tend to remain, and a compression-molded body having voids therein may be obtained. The voids appear to be dark spots in the SAT image.

However, it is considered that the encapsulating material of this disclosure, from which a compression-molded body having a large non-dark-spots ratio is obtained, is less likely to generate both resin-rich regions and voids due to its high fluidity. As described above, it is presumed that the highly fluid encapsulating material in which both the generation of the resin-rich region and the generation of voids are suppressed is less likely to cause sweep flow during compression molding.

Here, the SAT image of the compression-molded body of the encapsulating material is obtained as follows.

Specifically, first, a compression-molding base material in which chips are arranged on one surface of a substrate is prepared. An example of the substrate is one having a size of 240 mm in width×74 mm in length×0.45 mm in thickness. An example of the silicon chip is one having a size of 10 mm in width×8 mm in length×0.4 mm in thickness and having a material of silicon. The compression-molding base material is obtained, for example, by disposing a total of 12 chips (3 horizontal×4 vertical) in the center of one surface of the substrate in a state of being separated from each other at a separation distance of 8 mm.

By observing the compression-molded body on the silicon chips with an ultrasonic flaw detector while a compression-molding base material in which the silicon chips are placed on one surface of the substrate is used, as described above, not only the voids but also the resin-rich regions can be confirmed as dark spots. In addition, even if metal chips having a mirror surface are used instead of the silicon chips, the resin-rich regions still appear as dark spots. On the other hand, when a compression-molded body directly compression-molded on a substrate on which chips are not disposed (a general resin substrate or metal substrate, etc.) is observed with an ultrasonic flaw detector, voids can be confirmed as dark spots, but resin-rich regions are less likely to appear as dark spots.

Next, the encapsulating material to be measured is compression-molded, by a compression molding apparatus, on the surface of the compression-molding base material on which the chips are disposed.

The molding conditions during the compression molding are a mold temperature of 175° C., a molding pressure of about 10 MPa, a curing time of 120 seconds, and a vacuum holding time of 3 seconds.

Further, the thickness of the compression-molded body (that is, the compression-molded body for measuring the non-dark-spots ratio) obtained by the compression molding is, for example, 0.8 mm in a region in which the chip is not arranged (that is, the compression-molded body is directly disposed on the substrate), and 0.4 mm on the chips.

Next, an image is obtained by observing the obtained compression-molded body with a SAT (that is, an ultrasonic flaw detector, for example, model number "FS200 III A" made by Hitachi Power Solutions Co., Ltd.,). The SAT observation condition is a probe frequency of 50 MHz.

In the obtained image, the region corresponding to the image of the compression-molded body molded over the chips of the compression-molding base material is referred to as a "SAT image".

In the SAT image, when the contrast range of the image is 0 to 255, a region of 0 to 99 is defined as a "dark spot", and a region of 100 to 255 is defined as "other than dark spot".

Then, the non-dark-spots ratio in the SAT image is obtained by analyzing 12 chips of 10 mm×8 mm in total according to the above definition and totaling them.

Hereinafter, each component contained in the encapsulating material according to this disclosure will be described in details.

(Epoxy Resin)

The kind of the epoxy resin is not particularly limited, as long as it has an epoxy group in the molecule.

Specific examples of the epoxy resin include: novolak-type epoxy resins (phenolic novolak-type epoxy resins, and orthocresol novolak-type epoxy resins, etc.) formed by epoxidized a novolak resin obtained by condensing or co-condensing, in presence of an acidic catalyst, at least one phenolic compound selected from the group consisting of phenol compounds such as phenol, cresol, xylenol, resorcin, catechol, bisphenol A and bisphenol F and naphthol compounds such as α-naphthol, β-naphthol and dihydroxynaphthalene, and an aliphatic aldehyde compound such as formaldehyde, acetaldehyde or propionaldehyde; triphenylmethane-type epoxy resins obtained by epoxidizing a triphenylmethane-type phenolic resin obtained by condensing or co-condensing, in presence of an acidic catalyst, the above phenolic compounds and an aromatic aldehyde compound such as benzaldehyde or salicylaldehyde, etc.; copolymerization-type epoxy resins obtained by epoxidizing a novolak resin obtained by co-condensing, in presence of an acidic catalyst, the above phenol compounds or naphthol compounds, and an aldehyde compound; diphenylmethane-type epoxy resins which are diglycidyl ethers of bisphenol A or bisphenol F, etc.; biphenyl-type epoxy resins which are diglycidyl ethers of alkyl-substituted or unsubstituted biphenols; stilbene-type epoxy resins which are diglycidyl ethers of stilbene-based phenolic compounds; sulfur atom-containing epoxy resins which are diglycidyl ethers of bisphenol S, etc.; epoxy resins which are glycidyl ethers of alcohols such as butanediol, polyethylene glycol and polypropylene glycol, etc.; glycidyl ester-type epoxy resins which are glycidyl esters of polyvalent carboxylic acid compounds such as phthalic acid, isophthalic acid and tetrahydrophthalic acid, etc.; glycidylamine-type epoxy resins obtained by substituting, with a glycidyl group, an active hydrogen bonded to a nitrogen atom of aniline, diaminodiphenylmethane or isocyanuric acid, etc.; dicyclopentadiene-type epoxy resins obtained by epoxidizing co-condensation resins of dicyclopentadiene and a phenolic compound; alicyclic epoxy resins such as vinylcyclohexenediepoxide, 3,4-epoxycyclohexylmethyl-3,4-epoxycyclohexanecarboxylate, and 2-(3,4-epoxy)cyclohexyl-5,5-spiro(3,4-epoxy)cyclohexane-m-dioxane, etc., which are obtained by epoxidizing olefin bonds in a molecule; paraxylylene-modified epoxy resins which are glycidyl ethers of paraxylylene-modified phenolic resins; metaxylylene-modified epoxy resin which are glycidyl ethers of metaxylylene-modified phenolic resins; terpene-modified epoxy resins which are glycidyl ethers of terpene-modified phenolic resins; dicyclopentadiene-modified epoxy resins which are glycidyl ethers of dicyclopentadiene-modified phenolic resins; cyclopentadiene-modified epoxy resins which are glycidyl ethers of cyclopentadiene-modified phenolic resins; polycyclic aromatic ring-modified epoxy resins which are glycidyl ethers of polycyclic aromatic ring-modified phenolic resins; naphthalene-type epoxy resins which are glycidyl ethers of phenolic resins containing a naphthalene ring; halogenated phenolic novolak-type epoxy resins; hydroquinone-type epoxy resins; trimethylolpropane-type epoxy resins; linear aliphatic epoxy resins obtained by oxidizing an olefin bond with a peracid such as peracetic acid; and aralkyl-type epoxy resins which are resins formed by epoxidizing aralkyl-type phenolic resins such as phenolic aralkyl resins and naphthol aralkyl resins, and so on. Further examples of the epoxy resin include epoxidized products of silicone resins, and epoxidized products of acrylic resins, etc. These epoxy resins may each be used alone or may be used in combination of two or more.

Among the above epoxy resins, from the viewpoint of the balance between reflow resistance and fluidity, epoxy resin(s) selected from the group consisting of biphenyl-type epoxy resin, stilbene-type epoxy resin, diphenylmethane-type epoxy resin, sulfur atom-containing epoxy resin, novolak-type epoxy resin, dicyclopentadiene-type epoxy resin, triphenylmethane-type epoxy resin, copolymerization-type epoxy resin, and aralkyl-type epoxy resin is (are) preferable.

The epoxy equivalent (molecular weight/number of epoxy groups) of the epoxy resin is not particularly limited. From the viewpoint of balance between various properties such as moldability, reflow resistance and electrical reliability, the epoxy equivalent is preferably 100 g/eq to 1000 g/eq, and more preferably 150 g/eq to 500 g/eq.

The epoxy equivalent of the epoxy resin is a value measured by the method according to JIS K 7236: 2009.

When the epoxy resin is a solid, its softening point or melting point is not particularly limited. From the viewpoint of moldability and reflow resistance, the temperature is preferably 40° C. to 180° C., and from the viewpoint of handleability when preparing the encapsulating material, the temperature is more preferably 50° C. to 130° C.

The melting point of the epoxy resin is a value measured by differential scanning calorimetry (DSC), and the softening point of the epoxy resin is a value measured by the method (ring ball method) according to JIS K 7234: 1986.

The content of the epoxy resin in the encapsulating material is preferably 0.5 mass % to 50 mass %, more preferably 2 mass % to 30 mass %, and even more preferably 2 mass % to 20 mass %, from the viewpoints of strength, fluidity, heat resistance, moldability and so on.

(Curing Agent)

The kind of the curing agent is not particularly limited, and can be selected according to the kind of the resin, desired properties of the encapsulating material, and so on.

Examples of the curing agent include a phenol curing agent, an amine curing agent, an acid anhydride curing agent, a polymercaptan curing agent, a polyaminoamide curing agent, an isocyanate curing agent, a blocked-isocyanate curing agent and so on. From the viewpoint of improving heat resistance, the curing agent preferably has a phenolic hydroxyl group in the molecule (phenol curing agent).

Specific example of the phenol curing agent include: polyvalent phenolic compounds such as resorcin, catechol, bisphenol A, bisphenol F and substituted or unsubstituted biphenol, etc.; novolak-type phenolic resins obtained by condensing or co-condensing, in presence of an acidic catalyst, at least one phenolic compound selected from the group consisting of phenol compounds such as phenol, cresol, xylenol, resorcin, catechol, bisphenol A, bisphenol F, phenylphenol and aminophenol and naphthol compounds such as α-naphthol, β-naphthol and dihydroxynaphthalene, and an aldehyde compound such as formaldehyde, acetaldehyde, propionaldehyde, benzaldehyde or salicylaldehyde; aralkyl-type phenol resins such as, phenolic aralkyl resins synthesized from the above phenolic compounds and dimethoxyparaxylene or bis(methoxymethyl)biphenyl, and naphthol aralkyl resins, etc.; paraxylylene- and/or metaxylylene-modified phenolic resins; melamine-modified phenolic resins; terpene-modified phenolic resins; dicyclopentadiene-type phenolic resins synthesized by copolymerization of the above phenolic compounds and dicyclopentadiene, and dicyclopentadiene-type naphthol resins; cyclopentadiene-modified phenolic resins; polycyclic aromatic ring-modified phenolic resins; biphenyl-type phenol resins; triphenylmethane-type phenolic resins obtained by condensing or co-condensing the above phenolic compounds with an aromatic aldehyde compound such as benzaldehyde or salicylaldehyde, etc., in presence of an acidic catalyst; and phenolic resins obtained by copolymerizing two or more of the above compounds, and so on. These phenyl curing agents may each be used alone or may be used in combination of two or more.

The functional group equivalent of the curing agent (hydroxyl equivalent in the case of a phenol curing agent) is not particularly limited. From the viewpoint of the balance between various properties such as moldability, reflow resistance, electrical reliability and so on, the equivalent is preferably 70 g/eq to 1000 g/eq, and more preferably 80 g/eq to 500 g/eq.

The functional group equivalent of the curing agent (hydroxyl equivalent in the case of a phenol curing agent) is a value measured by the method according to JIS K 0070: 1992.

When the curing agent is a solid, its softening point or melting point is not particularly limited. From the viewpoint of moldability and reflow resistance, the temperature is preferably 40° C. to 180° C., and from the viewpoint of handleability during manufacturing of the encapsulating material, the temperature is more preferably 50° C. to 130° C.

The melting point or softening point of the curing agent is a value measured in the same manner as the melting point or softening point of the epoxy resin.

The equivalent ratio of the epoxy resin to the curing agent, that is, the ratio of the number of the functional groups in the curing agent to the number of the epoxy groups in the epoxy resin (the number of the functional groups in the curing agent/the number of the epoxy groups in the epoxy resin) is not particularly limited. From the correlation of suppressing each unreacted component to a small amount, the equivalent ratio is preferably set in the range of 0.5 to 2.0, and more preferably set in the range of 0.6 to 1.3. From the viewpoints of moldability and reflow resistance, the equivalent ratio is even more preferably set in the range of 0.8 to 1.2.

(Inorganic Filler)

The material of the inorganic filler is not particularly limited.

Specifically, examples of the material of the inorganic filler include inorganic materials such as spherical silica, crystalline silica, glass, alumina, calcium carbonate, zirconium silicate, calcium silicate, silicon nitride, aluminum nitride, boron nitride, magnesium oxide, silicon carbide, beryllia, and zirconia, zircon, Forsterite, steatite, spinel, mullite, titania, talc, clay, and mica, etc. An inorganic filler having a flame-retarding effect may be used. Examples of the inorganic filler having a flame-retarding effect include aluminum hydroxide, magnesium hydroxide, a composite metal hydroxide such as a composite hydroxide of magnesium and zinc, and zinc borate, etc.

The shape of the inorganic filler is not particularly limited, and a spherical shape is preferred from the viewpoints of fillability and mold wear resistance.

The inorganic fillers may each be used alone, or may be used in combination of two or more. In addition, "being used in combination of two or more" means, for example, a case where two or more kinds of inorganic fillers having the same component but different average particle sizes are used, a case where two or more kinds of inorganic fillers having the same average particle size but different components are used, or a case where two or more kinds of inorganic fillers having different average particle sizes and components are used.

As the inorganic filler, among the above specific examples, spherical silica, crystalline silica, and alumina are preferred, and spherical silica is more preferred.

The content of the inorganic filler in the entire encapsulating material is not particularly limited. From the viewpoint of further improving the properties such as the coefficient of thermal expansion, the thermal conductivity, and the elastic modulus of the compression-molded body of the encapsulating material, the content of the inorganic filler is preferably 30 vol % or more, more preferably 35 vol % or more, even more preferably 40 vol % or more, particularly preferably 45 vol % or more, and extremely preferably 50 vol % or more, of the entire encapsulating material. From the viewpoint of improving fluidity and reducing viscosity, the content of the inorganic filler is preferably 99 vol % or less, more preferably 98 vol % or less, and even more preferably 97 vol % or less, of the entire encapsulating material.

Moreover, the content of the inorganic filler in the entire encapsulating material of this disclosure used for compression molding may be 60 vol % to 99 vol %, may be 70 vol % to 99 vol %, may be 73 vol % to 99 vol %, and may be 75 vol % to 99 vol %.

The content of the inorganic filler in the encapsulating material is measured as follows. First, the total mass of the cured product of the encapsulating material (compression-molded body) is measured, the cured product is calcined at 400° C. for 2 hours and then at 700° C. for 3 hours to evaporate the resin component, and the mass of the remaining inorganic filler is measured. The volume is calculated from each obtained mass and the corresponding specific gravity, and the ratio of the volume of the inorganic filler to the total volume of the encapsulating material is obtained and taken as the content of the inorganic filler.

When the inorganic filler is in the form of particles, the average particle size thereof is not particularly limited. For example, the volume-average particle size of the entire inorganic filler is preferably 80 μm or less, and may be 50 μm or less, may be 40 μm or less, may be 30 μm or less, may be 25 μm or less, may be 20 μm or less, or may be 15 μm or less. Further, the volume-average particle diameter of the entire inorganic filler is preferably 0.1 μm or more, more preferably 0.2 μm or more, and even more preferably 0.3 μm or more. When the volume-average particle size of the inorganic filler is 0.1 μm or more, increase in the viscosity of the encapsulating material tends to be further suppressed. When the volume-average particle diameter is 80 μm or less, the fillability into a narrow gap tends to be further improved.

The average particle size of the inorganic filler can be measured by the following method.

The inorganic filler to be measured is added to a solvent (pure water), and after ultrasonic treatment for 300 seconds, the particle size distribution is measured. A volume-based particle size distribution is measured using a laser diffraction particle size distribution measuring device (trade name: LA-920; HORIBA, Ltd.). Then, the volume-average particle size is obtained as the particle diameter (D50%) when the accumulation from the small diameter side is 50% in the volume-based particle size distribution.

The specific surface area of the inorganic filler is preferably 0.7 m$^2$/g to 4.0 m$^2$/g, more preferably 0.9 m$^2$/g to 3.0 m$^2$/g, and even more preferably 1.0 m$^2$/g to 2.5 m$^2$/g, from the viewpoint of fluidity and moldability.

The fluidity of the encapsulating material tends to increase as the specific surface area of the inorganic filler decreases.

The specific surface area (BET specific surface area) of the inorganic filler can be measured from the nitrogen adsorption capacity according to JIS Z 8830: 2013. As the evaluation device, AUTOSORB-1 (trade name) made by QUANTACHROME company can be used. In measuring the BET specific surface area, it is considered that the water adsorbed on the surface of the sample and in the structure of the sample affects the gas adsorption capacity. Therefore, it is preferred to firstly perform a pretreatment of removing water by heating.

In the pretreatment, the measurement cell in which 0.05 g of the measurement sample is put is depressurized to 10 Pa or less using a vacuum pump, heated at 110° C. and thus held for 3 hours or more, and then naturally cooled to room temperature (25° C.) while depressurized state is maintained. After the pretreatment is performed, the evaluation temperature is set to 77K, and the evaluation pressure range is measured as a relative pressure (the equilibrium pressure with respect to the saturated vapor pressure) of less than 1.

The maximum particle size (cut point) of the inorganic filler may be controlled from the viewpoint of improving the fillability into a narrow gap. The maximum particle size of the inorganic filler may be appropriately adjusted, and from the viewpoint of fillability, it is preferably 105 μm or less, and more preferably 75 μm or less, may be 60 μm or less, or may be 40 μm or less. The maximum particle size can be measured using a laser diffraction particle size distribution meter (trade name: LA-920; HORIBA, Ltd.).

It is preferred that the inorganic filler has a maximum value of 0.1 μm to 2 μm in the volume-based particle size distribution from the viewpoint of achieving both improvement of thermal conductivity and improvement of fluidity. The inorganic filler may have maximum values in the region of 0.1 μm to 2 μm and the region of larger than 2 μm, respectively, in the volume-based particle size distribution.

An example of the inorganic filler having a maximum value at 0.1 μm to 2 μm in the volume-based particle size distribution is a mixture of a first inorganic filler having a volume-average particle size of 0.1 μm to 2 μm and a second inorganic filler having a volume-average particle size larger than 2 μm.

In a case where the inorganic filler is a mixture of the first inorganic filler and the second inorganic filler, the ratio of the first inorganic filler to the entire composition may be, for example, in the range of 2 mass % to 30 mass %. From the viewpoint of fluidity and fillability in narrow path portions, the ratio is preferably in the range of 2.5 mass % to 25 mass %, and more preferably in the range of 2.6 mass % to 20 mass %.

The volume-average particle size of the first inorganic filler is, for example, 0.1 μm to 2.0 μm, preferably 0.2 μm to 1.5 μm, and more preferably 0.3 μm to 1.0 μm. The volume-average particle size of the second inorganic filler is, for example, in the range of more than 2.0 μm to 75 μm, preferably 5.0 μm to 55 μm, and more preferably 8.0 μm to 20 μm.

Moreover, the BET specific surface area of the first inorganic filler is, for example, 1.0 m$^2$/g to 20 m$^2$/g, preferably 2 m$^2$/g to 17 m$^2$/g, more preferably 3 m$^2$/g to 15 m$^2$/g, and even more preferably 3.5 m$^2$/g to 10 m$^2$/g. The BET specific surface area of the second inorganic filler is, for example, 0.5 m$^2$/g to 10 m$^2$/g, preferably 0.7 m$^2$/g to 7 m$^2$/g, more preferably 0.9 m$^2$/g to 5 m$^2$/g, and even more preferably 1.0 m$^2$/g to 4.5 m$^2$/g.

Examples of the first inorganic filler include powders of spherical silica, alumina, calcium silicate, calcium carbonate, magnesium oxide, potassium titanate, silicon nitride, aluminum nitride, boron nitride, beryllia, zirconia, zircon, and titania, etc., and beads made by spheroidizing them, glass fibers, and so on. Among the examples, spherical silica is preferred from the viewpoint of improving fluidity. Examples of the second inorganic filler include powders of spherical silica, alumina, calcium silicate, calcium carbonate, magnesium oxide, potassium titanate, silicon nitride, aluminum nitride, boron nitride, beryllia, zirconia, zircon, and titania, etc., and beads made by spheroidizing them, glass fibers, and so on. Among the examples, spherical silica and alumina are preferred, and spherical silica is more preferred from the viewpoint of fillability and reduction of linear expansion coefficient. The combination of the first inorganic filler and the second inorganic filler is preferably a combination of spherical silica and alumina, a combination of spherical silica and spherical silica, or a combination of alumina and alumina. Among them, in particular, from the viewpoint of achieving both improvement in fluidity and improvement in heat conductivity, the combination of the first inorganic filler and the second inorganic filler is preferably a combination of spherical silica and alumina. Further, from the viewpoint of improving fluidity, the combination of the first inorganic filler and the second inorganic filler is preferably a combination of spherical silica and spherical silica.

The inorganic filler may be treated with a coupling agent. In particular, when the inorganic filler is a mixture of the first inorganic filler and the second inorganic filler, it is preferable that at least the first inorganic filler is treated with a coupling agent. By using a mixture of the first inorganic filler treated with the coupling agent and the second inorganic filler as the inorganic filler, the non-dark-spots ratio in the compression molded body is easy to be controlled within the above range. The second inorganic filler may be one treated with a coupling agent, or may not be treated.

In a case where the first inorganic filler has been treated with a coupling agent, the mass reduction ratio of the first inorganic filler at 800° C. is, for example, within the range of 0.27% to 1.0%. From the viewpoint of controlling the non-dark-spots ratio within the above range, the mass reduction ratio is preferably in the range of 0.3% to 0.9%, and more preferably in the range of 0.35% to 0.8%.

For the mass reduction ratio at 800° C., firstly, the mass $W_0$ before heating is measured for the inorganic filler to be measured without preheating or the like. After that, heating is performed at a rate of 10° C./min, and the mass $W_1$ of the inorganic filler when reaching 800° C. is measured. The mass reduction ratio (%) is obtained by the following formula:

$$\text{Mass reduction ratio (\%)} = ((W_0 - W_1)/W_0) \times 100$$

The kind of the coupling agent for treating the inorganic filler is not particularly limited, and a known coupling agent can be used. Examples of the coupling agent include silane coupling agent, titanium coupling agent, zirconium coupling agent, aluminum coupling agent, and so on. Among the examples, silane coupling agent and titanium coupling agent are preferred, and silane coupling agent is more preferred. The coupling agents for treating the inorganic filler may each be used alone, or may be used in combination of two or more.

The coupling agent for treating the inorganic filler preferably has at least one functional group (hereinafter, also referred to as "specific functional group") selected from (meth)acryloyl group, epoxy group and phenyl group, wherein phenyl group is more preferred.

The coupling agent may be a coupling agent having a functional group containing the specific functional group. Examples of the functional group containing the specific functional group include (meth)acryloyloxy group, glycidyloxy group, phenylamino group and so on. The coupling agent is preferably a silane coupling agent having a functional group containing the specific functional group, and more preferably a silane coupling agent in which the functional group containing the specific functional group is bonded to a silicon atom directly or via a chain hydrocarbon group having 1 to 5 carbon atoms.

Further, the coupling agent may be a coupling agent having at least one selected from a primary amino group, a secondary amino group and a tertiary amino group. The coupling agent may be a coupling agent having a secondary amino group among the above groups.

An example of the silane coupling agent is a compound in which at least one of an alkoxy group and a halogen atom is directly bonded to a Si atom.

Specific examples of the silane coupling agent include vinyltrichlorosilane, vinyltriethoxysilane, vinyltris(β-methoxyethoxy)silane, γ-methacryloxypropyltrimethoxysilane, 8-methacryloxyoctyltrimethoxysilane, β-(3,4-epoxycyclohexyl)ethyltrimethoxysilane, γ-glycidoxypropyltrimethoxysilane, vinyltriacetoxysilane, γ-mercaptopropyltrimethoxysilane, γ-aminopropyltriethoxysilane, γ-[bis(β-hydroxyethyl)]aminopropyltriethoxysilane, N-β-(aminoethyl)-γ-aminopropyltrimethoxysilane, γ-(β-aminoethyl)aminopropyldimethoxymethylsilane, N-(trimethoxysilylpropyl)ethylenediamine, N-(dimethoxymethylsilylisopropyl)ethylenediamine, methyltrimethoxysilane, methyltriethoxysilane, N-β-(N-vinylbenzylaminoethyl)-γ-aminopropyltrimethoxysilane, γ-chloropropyltrimethoxysilane, hexamethyldisilane, γ-anilinopropyltrimethoxysilane, vinyltrimethoxysilane, and γ-mercaptopropylmethyldimethoxysilane, etc.

Examples of titanium coupling agents include isopropyltriisostearoyl titanate, isopropyltris(dioctylpyrophosphate) titanate, isopropyltris(N-aminoethyl-aminoethyl) titanate, tetraoctylbis(ditridecylphosphite) titanate, tetra(2,2-diallyloxymethyl-1-butyl)bis(ditridecylphosphite) titanate, bis(dioctylpyrophosphate)oxyacetate titanate, bis(dioctylpyrophosphate)ethylene titanate, isopropyltrioctanoyl titanate, isopropyldimethacrylisostearoyl titanate, Isopropyltridodecylbenzenesulfonyl titanate, isopropylisostearoyldiacryl titanate, isopropyltris(dioctylphosphate) titanate, isopropyltricumylphenyl titanate, and tetraisopropylbis(dioctylphosphite) titanate, etc.

The amount of the coupling agent used to treat the inorganic filler is not particularly limited, and is set in consideration of the specific surface area of the inorganic filler, the minimum covering area of the coupling agent, and so on.

Relative to 100 parts by mass of the inorganic filler to be treated, the amount of the coupling agent used to treat the inorganic filler is, for example, in the range of 0.1 part by mass to 2.0 parts by mass, preferably in the range of 0.2 part by mass to 1.5 parts by mass, and more preferably in the range of 0.3 part by mass to 1.0 part by mass.

The method for obtaining the inorganic filler treated with the coupling agent is not particularly limited, and is, for example, a method in which the inorganic filler to be treated is added to a liquid containing the coupling agent and a solvent and then the solvent is removed by drying.

(Additive)

The encapsulating material of the present disclosure may contain other component as an additive, if required. Examples of the additive include a coupling agent, a curing accelerator, an ion exchanger, a releasing agent, a flame retardant, a colorant, a stress relaxing agent and so on. It is also possible that the encapsulating material contains various additives well known in the art other than the above additives, if required.

—Coupling Agent—

The encapsulating material of this disclosure may contain a coupling agent as an additive. Examples of the coupling agent used as the additive include the same coupling agents as those for treating the inorganic filler as mentioned above. The coupling agents used as an additive may each be used alone, or may be used in combination of two or more.

The encapsulating material using a coupling agent as an additive contains, for example, a first coupling agent adhering to the surface of the inorganic filler and a second coupling agent used as the additive. In a case where the encapsulating material contains both a first coupling agent and a second coupling agent, as the second coupling agent, the same material of the first coupling agent may be, or a coupling agent different from the first coupling agent may be used. When the encapsulating material contains a first coupling agent and a second coupling agent, the mass ratio of the first coupling agent to the second coupling agent (first coupling agent/second coupling agent) is, for example, in the range of more than 0 to 0.2, preferably in the range of more than 0 to 0.15, and more preferably in the range of more than 0 to 0.1.

When the encapsulating material contains a coupling agent, the content of the coupling agent relative to the entire encapsulating material is preferably 3 mass % or less, more preferably 2 mass % or less, even more preferably 1 mass % or less, and particularly preferably 0.5 mass % or less. From the viewpoint of exerting the effect, the content is preferably 0.1 mass % or more, more preferably 0.15 mass % or more, and even more preferably 0.18 mass % or more.

Further, the content of the coupling agent may be 0.01 part by mass or more or 0.02 part by mass or more relative to 100 parts by mass of the inorganic filler. The content of the coupling agent is preferably 5 parts by mass or less, and more preferably 2.5 parts by mass or less, relative to 100 parts by mass of the inorganic filler. From the viewpoint of achieving both fluidity and moldability of the package, the content of the coupling agent relative to 100 parts by mass of the inorganic filler is preferably 0.05 part by mass to 2.0 parts by mass, more preferably 0.1 part by mass to 1.5 parts by mass, even more preferably 0.2 part by mass to 1.0 part by mass, and particularly preferably 0.2 part by mass to 0.5 part by mass.

In addition, the percentage and the content of the coupling agent are shown as the percentage and the content of all the coupling agents contained in the encapsulating material, respectively. That is, in a case where the encapsulating material contains the first coupling agent and the second coupling agent, the percentage and the content of the coupling agent are shown as the total percentage and the total content of the first coupling agent and the second coupling agent, respectively.

—Curing Accelerator—

The encapsulating material of this disclosure may contain a curing accelerator as an additive. The kind of the curing accelerator is not particularly limited, and can be selected according to the kind of the epoxy resin, the desired properties of the encapsulating material, and so on.

Examples of the curing accelerator include: cyclic amidine compounds such as, diazabicycloalkenes such as 1,5-diazabicyclo[4.3.0]nonene-5 (DBN) and 1,8-diazabicyclo[5.4.0]undecene-7 (DBU), etc., 2-methylimidazole, 2-phenylimidazole, 2-phenyl-4-methylimidazole, and 2-heptadecylimidazole, etc.; derivatives of the above cyclic amidine compounds; phenolic novolak salts of the above cyclic amidine compounds or their derivatives; compounds having intramolecular polarization formed by adding, to these compound, a compound having a π-bond, such as maleic anhydride, or a quinone compound such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone or phenyl-1,4-benzoquinone, or diazophenylmethane, etc.; cyclic amidinium compounds such as tetraphenylborate salt of DBU, tetraphenylborate salt of DBN, tetraphenylborate salt of 2-ethyl-4-methylimidazole, and tetraphenylborate salt of N-methylmorpholine, etc.; tertiary amine compounds such as pyridine, triethylamine, triethylenediamine, benzyldimethylamine, triethanolamine, dimethylaminoethanol and tris(dimethylaminomethyl)phenol, etc.; derivatives of the above tertiary amine compounds; ammonium salt compounds such as tetra-n-butylammonium acetate, tetra-n-butylammonium phosphate, tetraethylammonium acetate, tetra-n-hexylammonium benzoate, and tetrapropylammonium hydroxide, etc.; organic phosphines such as, primary phosphines such as ethylphosphine and phenylphosphine, etc., secondary phosphines such as dimethylphosphine and diphenylphosphine, etc., tertiary phosphines such as triphenylphosphine, diphenyl(p-tolyl)phosphine, tris(alkylphenyl)phosphine, tris(alkoxyphenyl)phosphine, tris(alkyl-alkoxyphenyl)phosphine, tris(dialkylphenyl)phosphine, tris(trialkylphenyl)phosphine, tris(tetraalkylphenyl)phosphine, tris(dialkoxyphenyl)phosphine, tris(trialkoxyphenyl)phosphine, tris(tetraalkoxyphenyl)phenyl)phosphine, trialkylphosphine, dialkylarylphosphine, alkyldiarylphosphine, trinaphthylphosphine, tris(benzyl)phosphine, etc.; phosphine compounds such as a complex of an above organic phosphine and an organic boron species; compounds having intramolecular polarization formed by adding, to the above organic phosphines or the above phosphine compounds, a compound having a π-bond, such as maleic anhydride, or a quinone compound such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone, phenyl-1,4-benzoquinone or anthraquinone, or diazophenylmethane, etc.; compounds having intramolecular polarization obtained by reacting, with the above organic phosphines or the above phosphine compounds, a halogenated phenol compound such as 4-bromophenol, 3-bromophenol, 2-bromophenol, 4-chlorophenol, 3-chlorophenol, 2-chlorophenol, 4-iodophenol, 3-iodophenol, 2-iodophenol, 4-bromo-2-methylphenol, 4-bromo-3-methylphenol, 4-bromo-2,6-dimethylphenol, 4-bromo-3,5-dimethylphenol, 4-bromo-2,6-di-t-butylphenol, 4-chloro-1-naphthol, 1-bromo-2-naphthol, 6-bromo-2-naphthol or 4-bromo-4'-hydroxybiphenyl, etc., and then conducting a dehydrohalogenation step; tetra-substituted phosphonium compounds such as tetra-substituted phosphoniums such as tetraphenylphosphonium, tetra-phenylborate salts of tetra-substituted phosphoniums such as tetraphenylphosphonium tetra-p-tolylborate, and salts of a tetra-substituted phosphonium and a phenol compound, etc.; phosphobetaine compounds; and adducts of a phosphobetaine compound and a silane compound, and so on. The curing accelerators may each be used alone or may be used in combination of two or more.

Among these, particularly suitable curing accelerators include triphenylphosphine, an adduct of triphenylphosphine and a quinone compound, an adduct of tributylphosphine and a quinone compound, and an adduct of tri-p-tolylphosphine and a quinone compound, etc.

In a case where the encapsulating material contains a curing accelerator, the amount thereof is preferably 0.1 part by mass to 30 parts by mass, and more preferably 1 part by mass to 15 parts by mass, relative to 100 parts by mass of the resin component (that is, the total of the epoxy resin and the curing agent). When the amount of the curing accelerator is 0.1 part by mass or more relative to 100 parts by mass of the resin component, curing can be well carried out in short time. When the amount of the curing accelerator is 30 parts by mass or less relative to 100 parts by mass of the resin component, the curing rate is not too high and a good molded product tends to be obtained.

—Ion Exchanger—

The encapsulating material of this disclosure may contain an ion exchanger as an additive. The encapsulating material preferably contains an ion exchanger from the viewpoint of improving the moisture resistance and high temperature standing characteristic of the electronic part device including the element to be encapsulated. The ion exchanger is not particularly limited, and conventionally known ones can be used. Specific examples thereof include hydrotalcite compounds, and hydrous oxides of at least one element selected from the group consisting of magnesium, aluminum, titanium, zirconium and bismuth. The ion exchangers may each be used alone or may be used in combination of two or more, wherein a hydrotalcite represented by the following general formula (A) is preferable.

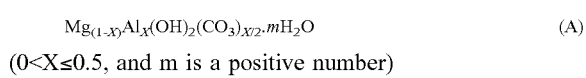

$$Mg_{(1-X)}Al_X(OH)_2(CO_3)_{X/2} \cdot mH_2O \qquad (A)$$

($0 < X \leq 0.5$, and m is a positive number)

When the encapsulating material contains an ion exchanger, the content thereof is not particularly limited as long as it is sufficient to capture ions such as halogen ions. For example, the content is preferably 0.1 part by mass to 30 parts by mass, and more preferably 1 part by mass to 10 parts by mass, relative to 100 parts by mass of the resin component.

—Releasing Agent—

The encapsulating material of this disclosure may contain a releasing agent as an additive from the viewpoint of obtaining good release property from the mold in the molding. The releasing agent is not particularly limited, and conventionally known releasing agents can be used. Specific examples thereof include higher fatty acids such as carnauba wax, montanic acid and stearic acid, ester-based waxes such as metal salts of higher fatty acids and montanic acid esters, polyolefin waxes such as polyethylene oxide and non-oxidized polyethylene, and so on. The release agent may each be used alone or may be used in combination of two or more.

In a case where the encapsulating material contains a releasing agent, the amount thereof is preferably 0.01 part by mass to 10 parts by mass, and more preferably 0.1 part by mass to 5 parts by mass, relative to 100 parts by mass of the resin component. When the amount of the releasing agent is 0.01 part by mass or more relative to 100 parts by mass of the resin component, the releasing property tends to be sufficiently obtained. When the amount is 10 parts by mass or less, better adhesiveness and curability tend to be obtained.

In addition, the content of the releasing agent relative to 100 parts by mass of the resin component may be less than 0.1 part by mass or less than 0.01 part by mass.

—Flame Retardant—

The encapsulating material of this disclosure may contain a flame retardant as an additive. The flame retardant is not particularly limited, and conventionally known flame retardants can be used. Specific examples thereof include organic or inorganic compounds containing halogen atom, antimony atom, nitrogen atom or phosphorus atom, metal hydroxides, and so on. The flame retardants may each be used alone or may be used in combination of two or more.

When the encapsulating material contains a flame retardant, the amount thereof is not particularly limited as long as it is sufficient to obtain the desired flame retardant effect. For example, the amount is preferably 1 part by mass to 30 parts by mass, and more preferably 2 parts by mass to 20 parts by mass, relative to 100 parts by mass of the resin component.

—Colorant—

The encapsulating material of this disclosure may further contain a colorant as an additive. Examples of the colorant include known colorants such as carbon black, organic dyes, organic pigments, titanium oxide, red lead, and red iron oxide. The content of the colorant can be appropriately selected according to the purpose and so on. The colorants may each be used alone or may be used in combination of two or more.

—Stress Relaxing Agent—

The encapsulating material of this disclosure may contain a stress relaxing agent such as silicone oil or silicone rubber particles as an additive. By containing a stress relaxing agent, it is possible to further reduce the warpage deformation of the package and the occurrence of package cracks. Examples of the stress relaxing agent include commonly used known stress relaxing agents (flexibility agents). Specific examples include: thermoplastic elastomers such as silicone-based, styrene-based, olefin-based, urethane-based, polyester-based, polyether-based, polyamide-based and polybutadiene-based thermoplastic elastomers, rubber particles such as NR (natural rubber) particles, NBR (acrylonitrile-butadiene rubber) particles, acrylic rubber particles, urethane rubber particles and silicone powder, rubber particles having a core-shell structure such as methyl methacrylate-styrene-butadiene copolymer (MBS), methyl methacrylate-silicone copolymer and methyl methacrylate-butyl acrylate copolymer, and so on. The stress relaxing agents may each be used alone or may be used in combination of two or more.

(Preparation Method of Encapsulating Material)

The method for preparing the encapsulating material is not particularly limited. As a general method, a method in which the respective components are sufficiently mixed by a mixer or the like and then melt-kneaded by a mixing roll, an extruder or the like, cooled and pulverized can be mentioned. More specifically, for example, a method in which the above-mentioned components are stirred and mixed, kneaded with a kneader, roll, extruder or the like preheated to 70° C. to 140° C., cooled and pulverized can be mentioned.

(Properties of Encapsulating Material)

The non-dark-spots ratio after the encapsulating material of this disclosure is made into a compression-molded body is 86% or more, and, from the viewpoint of suppressing wire sweep caused by compression molding, preferably 89% or more, and more preferably 91% or more.

As a method for obtaining a encapsulating material having a non-dark-spots ratio of 86% or more after being made into a compression-molded body product, as described above, for example, a method using, as the inorganic filler, a mixture of the first inorganic filler having been treated with a coupling agent and the second inorganic filler can be mentioned. In a case where the above mixture is used as the inorganic filler, for example, by adjusting the kind and amount of the coupling agent for treating the first inorganic filler, the non-dark-spots ratio in the compression-molded body can be controlled.

The encapsulating material of this disclosure may be solid or liquid at normal temperature and pressure (for example, 25° C. and atmospheric pressure), and is preferably solid. When the encapsulating material is a solid, the shape is not particularly limited, and examples thereof include powder, granules, and tablets. In a case where the encapsulating material has a tablet shape, it is preferred that the dimensions and mass thereof match the molding conditions of the package from the viewpoint of handleability.

<Electronic Part Device>

The electronic part device according to an aspect of this disclosure includes an element encapsulated by the above-mentioned encapsulating material. That is, the electronic part device includes an element and a cured product of an encapsulating material that encapsulates the element.

The electronic part device is exemplified by one having an element portion encapsulated by an encapsulating material that is obtained by mounting an element (active elements such as semiconductor chip, transistor, diode and thyristor, passive elements such as capacitor, resistor and coils, and so on) on a support member such as a lead frame, a pre-wired tape carrier, a wiring board, glass, a silicon wafer, or an organic substrate.

More specific examples include: general resin-encapsulated ICs such as DIP (Dual Inline Package), PLCC (Plastic Leaded Chip Carrier), QFP (Quad Flat Package), SOP (Small Outline Package), SOJ (Small Outline J-lead package), TSOP (Thin Small Outline Package) and TQFP (Thin Quad Flat Package), which has a structure formed by fixing an element on a lead frame, connecting the terminal part of the element such as bonding pads with the lead part by wire bonding or bumps, etc., and then using the encapsulating material to encapsulate the element by compression molding or the like; TCP (Tape Carrier Package) having a structure in which an element connected to a tape carrier via a bump is encapsulated by the encapsulating material; COB (Chip On Board) module, hybrid IC, and multi-chip module, etc., each of which has a structure in which an element connected to a wiring formed on a support member by wire bonding, flipping chip bonding or solder, etc. is encapsulated by a encapsulating material; and BGA (Ball Grid Array), CSP (Chip Size Package) and MCP (Multi Chip Package), each of which has a structure formed by mounting an element on the surface of a support member having terminals for connecting wiring board on the back surface, connecting the element with a wiring formed on the support member via bumps or wire bonding, and encapsulating the element by the encapsulating material. Further, the encapsulating material can also be preferably used in a printed wiring board.

The method of encapsulating the electronic part device using the encapsulating material is not particularly limited, and examples thereof include a general compression molding method.

EXAMPLES

The above embodiments will be specifically described with Examples, but the scope of the above embodiments is not limited to these Examples.
<Production of Encapsulating Material>
First, the respective components described below were prepared.
(A) Epoxy Resin
Epoxy resin A1: jER YX-4000 (trade name), produced by Mitsubishi Chemical Corporation.
Epoxy resin A2: Epotohto YSLV-80XY (trade name), produced by NIPPON STEEL Chemical & Material Co, Ltd.
Epoxy resin A3: EPPN-501HY (trade name), produced by Nippon Kayaku Co., Ltd.
(B) Curing Agent
Curing agent B1: MEH-7851 (trade name), produced by MEIWA PLASTIC INDUSTRIES, LTD.
Curing agent B2: MEH-7500 (trade name), produced by MEIWA PLASTIC INDUSTRIES, LTD.
(C) Inorganic Filler
Inorganic filler C1: the product of treating silica particles (first inorganic filler, volume average particle size: 0.5 an, specific surface area: 5.5 m$^2$/g, spherical silica) by a coupling agent (N-phenyl-3-aminopropyltrimethoxysilane, also named γ-anilinopropyltrimethoxysilane, trade name: "KBM-573", 0.6 mass part relative to 100 mass parts of the silica particles), which had a mass reduction ratio of 0.38% at 800° C.
Inorganic filler C2: the product of treating silica particles (first inorganic filler, volume average particle size: 0.5 μm, specific surface area: 5.5 m$^2$/g, spherical silica) by a coupling agent (3-methacryloxypropyltrimethoxysilane, also named γ-methacryloxypropyltrimethoxysilane, trade name: "KBM-503", 0.7 mass part relative to 100 mass parts of the silica particles), which had a mass reduction ratio of 0.41% at 800° C.
Inorganic filler C3: the product of treating silica particles (first inorganic filler, volume average particle size: 0.5 μm, specific surface area: 5.5 m$^2$/g, spherical silica) by a coupling agent (3-glycidoxypropyltrimethoxysilane, also named γ-glycidoxypropyltrimethoxysilane, trade name: "KBM-403", 0.6 mass part relative to 100 mass parts of the silica particles), which had a mass reduction ratio of 0.38% at 800° C.
Inorganic filler C4: silica particles (first inorganic filler, volume average particle size: 0.5 μm, specific surface area: 5.5 m$^2$/g, spherical silica without treatment of a coupling agent).
Inorganic filler C5: the product of treating silica particles (second inorganic filler, volume average particle size: 15 μm, specific surface area: 4.0 m$^2$/g, spherical silica) by a coupling agent (N-phenyl-3-aminopropyltrimethoxysilane, trade name: "KBM-573", 0.6 mass part relative to 100 mass parts of the silica particles).
Inorganic filler C6: silica particles (second inorganic filler, volume average particle size: 15 μm, specific surface area: 4.0 m$^2$/g, spherical silica without treatment of a coupling agent)
Inorganic filler C7: the product of treating silica particles (first inorganic filler, volume average particle size: 0.5 μm, specific surface area: 5.5 m$^2$/g, spherical silica) by a coupling agent (N-phenyl-3-aminopropyltrimethoxysilane, also named γ-anilinopropyltrimethoxysilane, trade name: "KBM-573", 0.9 mass part relative to 100 mass parts of the silica particles), which had a mass reduction ratio of 0.73% at 800° C.
Inorganic filler C8: the product of treating silica particles (first inorganic filler, volume average particle size: 0.5 μm, specific surface area: 5.5 m$^2$/g, spherical silica) by a coupling agent (N-phenyl-3-aminopropyltrimethoxysilane, also named γ-anilinopropyltrimethoxysilane, trade name: "KBM-573", 1.0 mass part relative to 100 mass parts of the silica particles).
(D) Coupling Agent as an Additive
Coupling agent D1: N-phenyl-3-aminopropyltrimethoxysilane (silane coupling agent, trade name: "KBM-573", produced by Shin-Etsu Chemical Co., Ltd.)
Coupling agent D2: 3-methacryloxypropyltrimethoxysilane (silane coupling agent, trade name: "KBM-503", produced by Shin-Etsu Chemical Co, Ltd.)
Coupling agent D3: 3-glycidoxypropyltrimethoxysilane (silane coupling agent, trade name: "KBM-403", produced by Shin-Etsu Chemical Co, Ltd.)
(E) Curing Accelerator
Accelerator E1: adduct of tri-p-tolylphosphine and 1,4-benzoquinone The respective components shown in Tables 1 and 2 were mixed in the amounts shown in the same table (unit: parts by mass), sufficiently mixed with a mixer, and then melt-kneaded at 100° C. for 2 minutes using a twin-screw kneader. Next, after the melt was cooled, the solidified material was pulverized into a powder to prepare a desired powdery encapsulating material. In the tables, blanks indicate that the corresponding components were not mixed.

Tables 1 and 2 show the content of the inorganic filler in the entirety of the obtained encapsulating material.

Tables 1 and 2 also show, for the obtained encapsulating material, the non-dark-spots ratio in the SAT image of the compression-molded body, which was obtained with the above method.

Further, when the volume-based particle size distribution of the inorganic filler contained in the obtained encapsulating material was obtained by the above method, there were maximum values at 0.5 μm and 15 μm in both of the Examples and the Comparative Examples.

In addition, the obtained encapsulating materials were evaluated by various tests shown below. The evaluation results are shown in Tables 1 and 2.

<Evaluation of Spiral Flow Length>

A spiral flow measuring die conforming to the standard (EMMI-1-66) was used, and the obtained encapsulating material was injected at a hydraulic pressure of 70 kgf/cm² (6.86 MPa), which is the value converted to the pressure at the bottom of the plunger. The length of the molded product when molded under the conditions of 175° C. and 120 seconds was defined as the flow distance (spiral flow length). Then, while the flow distance in Comparative Example 1 was set to 100, the converted value of the flow distance in each of the Examples and the Comparative Examples was obtained. The results are shown in Tables 1 and 2. In addition, the meaning of the converted value of the flow distance is that the larger the value, the longer the flow distance.

<Evaluation of Wire Sweep>

The obtained encapsulating material was used to encapsulate a package with a compression molding machine (PMC-1040 manufactured by TOWA Corporation) under molding conditions of a molding temperature of 175° C. and a molding time of 120 seconds, and was post-cured at 175° C. for 5 hours, so as to obtain a semiconductor device. This semiconductor device was a ball grid array (BGA) package (resin-encapsulated portion size: 228 mm×67 mm×thickness: 1 mm), and had a chip size of 7.5 mm×7.5 mm. The wire had a gold wire diameter of 18 μm and an average gold wire length of 5 mm. Then, the prepared package was observed with a soft X-ray analyzer for the deformation state of the gold wire to examine the presence or absence of deformation (deformation rate from the initial shape). Specifically, the maximum displacement of the wire was measured by X-ray, and the deformation rate, which is the value obtained by dividing the obtained maximum displacement value by the loop length and multiplying by 100, was calculated. This deformation rate was taken as the wire sweep rate.

Then, while the wire sweep rate in Comparative Example 1 was set to 100, the converted value of the wire sweep rate in each of the Examples and the Comparative Examples was obtained. The results are shown in Tables 1 and 2, wherein the meaning of the converted value of the wire sweep rate is that the smaller the value, the lower the wire sweep rate.

TABLE 1

|  |  | Example 1 | Example 2 | Example 3 | Comparative Example 1 | Comparative Example 2 | Comparative Example 3 | Example 4 | Example 5 | Example 6 | Comparative Example 4 |
|---|---|---|---|---|---|---|---|---|---|---|---|
| Epoxy resin | A1 | 20 | 20 | 20 | 20 | 20 | 20 | 20 | 20 | 20 | 20 |
|  | A2 | 80 | 80 | 80 | 80 | 80 | 80 | 80 |  |  |  |
|  | A3 |  |  |  |  |  |  |  | 80 | 80 | 80 |
| Curing Agent | B1 | 40 | 40 | 40 | 40 | 40 | 40 | 40 | 44 | 44 | 44 |
|  | B2 | 33 | 33 | 33 | 33 | 33 | 33 | 33 | 36 | 36 | 36 |
| Inorganic filler | C1 | 45 |  |  |  |  |  | 45 | 110 | 110 |  |
|  | C2 |  | 45 |  |  |  |  |  |  |  |  |
|  | C3 |  |  | 45 |  |  |  |  |  |  |  |
|  | C4 |  |  |  | 45 | 45 | 45 |  |  |  | 110 |
|  | C5 |  |  |  |  |  |  | 1470 |  |  |  |
|  | C6 | 1470 | 1470 | 1470 | 1470 | 1470 | 1470 |  | 1230 | 1230 | 1230 |
| Coupling agent | D1 | 3 |  |  | 4 |  |  |  | 3 |  | 3 |
|  | D2 |  | 3 |  |  | 4 |  |  |  | 3 |  |
|  | D3 |  |  | 3 |  |  | 4 |  |  |  |  |
| Accelerator | E1 | 2 | 2 | 2 | 2 | 2 | 2 | 2 | 4 | 4 | 4 |
| Content of inorganic filler | vol % | 79 | 79 | 79 | 79 | 79 | 79 | 79 | 77 | 77 | 77 |
|  | mass % | 87.5 | 87.5 | 87.5 | 87.5 | 87.5 | 87.5 | 87.5 | 86 | 86 | 86 |
| Non-dark-spots ratio (%) |  | 92 | 91 | 91 | 83 | 84 | 78 | 93 | 90 | 90 | 75 |
| Spiral flow length (converted value) |  | 102 | 102 | 100 | 100 | 100 | 99 | 121 | 100 | 104 | 97 |
| Wire sweep (converted value) |  | 72 | 70 | 80 | 100 | 90 | 110 | 32 | 83 | 81 | 102 |

TABLE 2

|  |  | Example 7 | Comparative Example 5 |
|---|---|---|---|
| Epoxy resin | A1 | 20 | 20 |
|  | A2 | 80 | 80 |
|  | A3 |  |  |
| Curing Agent | B1 | 40 | 40 |
|  | B2 | 33 | 33 |
| Inorganic filler | C7 | 45 |  |
|  | C8 |  | 45 |
|  | C9 |  |  |
|  | C5 |  |  |
|  | C6 | 1470 | 1470 |
| Coupling agent | D1 | 3 | 3 |
|  | D2 |  |  |
|  | D3 |  |  |
| Accelerator | E1 | 2 | 2 |
| Content of inorganic filler | vol % | 79 | 79 |
|  | mass % | 87.5 | 87.5 |
| Non-dark-spots ratio (%) |  | 87 | 85 |
| Spiral flow length (converted value) |  | 102 | 102 |
| Wire sweep (converted value) |  | 65 | 86 |

It is clear from the results of Tables 1 and 2 that the encapsulating materials of the Examples, which had non-dark-spots ratios of 86% or more in the SAT images after being made into compression-molded bodies, reduced the occurrence probability of wire sweep as compared with those of the Comparative Examples.

The disclosure of International Patent Application No. PCT/JP2019/035934, filed on Sep. 12, 2019, is incorporated in this specification by reference in its entirety.

All documents, patent applications and technical standards described in this specification are each incorporated herein by reference to the same extent as cases where they are specifically and individually described, and are thus quoted and incorporated in this specification.

The invention claimed is:

1. An encapsulating material for compression molding, comprising an epoxy resin, a curing agent, and a mixture of a pre-treated first inorganic filler and a second inorganic filler, wherein
in an image obtained by observing, by an ultrasonic flaw detector, a compression-molded body formed by compression-molding the encapsulating material for compression molding on a substrate with a silicon chip interposed, an area of a portion other than dark spots of a region corresponding to the compression-molded body on the silicon chip is 86% or more of an area of the entire region corresponding to the compression-molded body on the silicon chip,
the pre-treated first inorganic filler has been pre-treated with a coupling agent,
a mass reduction ratio of the pre-treated first inorganic filler at 800° C. is in a range of 0.35% to 0.8%,
the pre-treated first inorganic filler has a volume-average particle size of 0.1 μm to 2 μm,
the second inorganic filler has a volume-average particle size larger than 2 μm, and
a ratio of the pre-treated first inorganic filler to the encapsulating material is in a range of 2 mass % to 30 mass %.

2. The encapsulating material for compression molding of claim 1, wherein the coupling agent comprises a silane coupling agent.

3. The encapsulating material for compression molding of claim 1, wherein the coupling agent has at least one functional group selected from a (meth) acryloyl group, an epoxy group and a phenyl group.

4. The encapsulating material for compression molding of claim 1, wherein the coupling agent has a secondary amino group.

5. An electronic part device, comprising: an element; and a cured product of the encapsulating material for compression molding of claim 1 that encapsulates the element.

* * * * *